(12) United States Patent
Bischof

(10) Patent No.: US 7,486,093 B2
(45) Date of Patent: Feb. 3, 2009

(54) ARRANGEMENT FOR CONTACTING AN INTEGRATED CIRCUIT IN A PACKAGE

(75) Inventor: Werner Bischof, Besigheim (DE)

(73) Assignee: Atmel Germany GmbH, Heilbronn (DE)

( * ) Notice: Subject to any disclaimer, the term of this patent is extended or adjusted under 35 U.S.C. 154(b) by 80 days.

(21) Appl. No.: 11/281,533

(22) Filed: Nov. 18, 2005

(65) Prior Publication Data

US 2006/0109018 A1 May 25, 2006

(30) Foreign Application Priority Data

Nov. 19, 2004 (DE) .................. 10 2004 055 955

(51) Int. Cl.
*G01R 31/26* (2006.01)
(52) U.S. Cl. ...................................... 324/765
(58) Field of Classification Search .......... None
See application file for complete search history.

(56) References Cited

U.S. PATENT DOCUMENTS

| 6,482,013 | B2 | 11/2002 | Eldridge et al. |
| 6,812,718 | B1 | 11/2004 | Chong et al. |
| 7,173,442 | B2 * | 2/2007 | Treibergs et al. ............ 324/762 |
| 2003/0146770 | A1 | 8/2003 | Ivanov |
| 2005/0046433 | A1 * | 3/2005 | Treibergs et al. ............ 324/763 |
| 2006/0186551 | A1 * | 8/2006 | Lange et al. ................ 257/778 |
| 2007/0040566 | A1 * | 2/2007 | Lee ............................ 324/765 |

* cited by examiner

*Primary Examiner*—Jermele M Hollington
(74) *Attorney, Agent, or Firm*—Muncy, Geissler, Olds & Lowe, PLLC

(57) ABSTRACT

An arrangement is provided for contacting an integrated circuit in a package by a contact plate arranged on a circuit carrier, wherein the package has contact locations on the contact plate side. In this context, the contact plate has contact vanes, which are formed such that they have a spring action directed normal to the circuit carrier and such that the contact vanes can be brought parallel to the circuit carrier by pressing the package against the contact vanes. The contact locations and contact vanes each establish an electrical connection with one another in the state in which they are pressed against the circuit carrier.

25 Claims, 3 Drawing Sheets

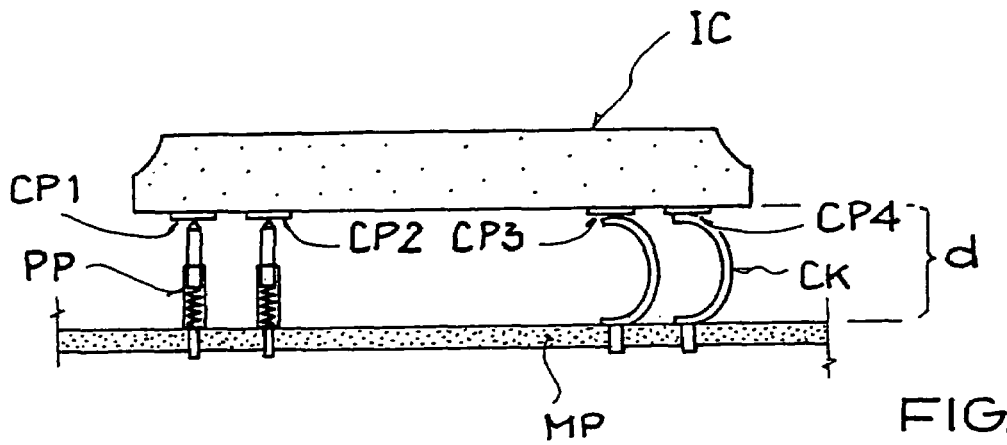
FIG. 3a
Conventional Art
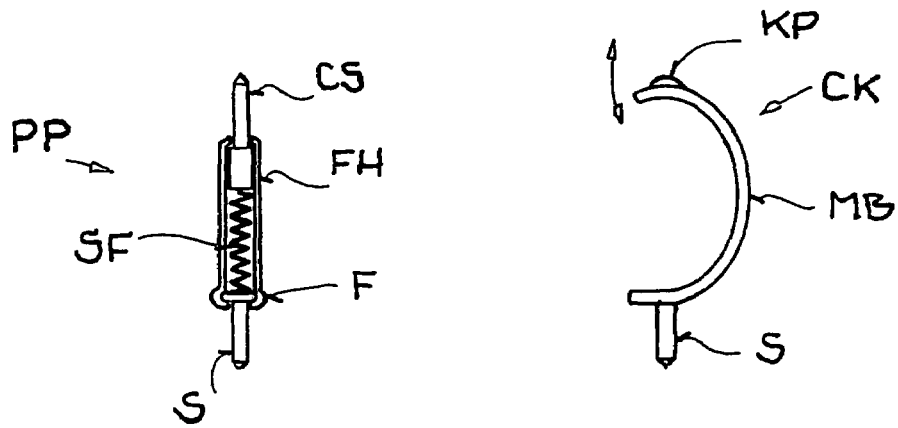
FIG. 3b
Conventional Art
FIG. 3c
Conventional Art

US 7,486,093 B2

ARRANGEMENT FOR CONTACTING AN INTEGRATED CIRCUIT IN A PACKAGE

This nonprovisional application claims priority under 35 U.S.C. § 119(a) on German Patent Application No. DE 102004055955.4, which was filed in Germany on Nov. 19, 2004, and which is herein incorporated by reference.

BACKGROUND OF THE INVENTION

1. Field of the Invention

The present invention relates to an arrangement for contacting an integrated circuit in a package, in particular for testing the circuit.

2. Description of the Background Art

In order to test the functionality of integrated circuits prior to shipment, these integrated circuits (ICs=integrated circuits), also known as chips, which are generally embedded in packages, are placed in test or measurement boards. By coupling in and out and analyzing test and measurement signals the functionality of the tested integrated circuit can then be determined. The tested integrated circuit is then separated from the measurement board and, depending on the test results, is delivered for actual use or is rejected. Fast and reliable contacting with the measurement board is necessary in order to be able to test the relevant integrated circuits quickly and efficiently.

FIG. 3a shows a conventional contacting of an IC for test. In this context, the chip IC that is to be tested has multiple contact pins CP1-CP4, which must be electrically connected to a measurement board MP. The measurement board MP has test and analysis circuits which are not shown here. Typically-called pogo pins PP or C-contacts CK, for example, are known as resilient connectors between the measurement board MP and the connecting pins CP1-CP4 of the chip IC. In each case, the pogo pins PP and C contacts CK are permanently attached to the measurement board MP.

FIG. 3b shows a detail view of a pogo pin PP constructed of a guide sleeve FH, which has a base F and a mounting pin S, for example for soldering to the measurement board MP. A contact pin CS, which is spring-loaded by means of the coil spring SF, is introduced into the guide sleeve FH. While thin contact pins CS make it possible to reliably contact small connecting pins CP1, CP2, the many mechanical parts make pogo pins failure-prone. Moreover, as a result of the size of the guide sleeve FH, the distance d between the chip IC under test and the measurement board MP is relatively great. In addition, as a result of the small contact area, little or no heat transfer from the chip to the measurement board MP is possible.

The principle of operation of the C contacts CK, which are also known, is shown in FIG. 3c. C contacts are made of metal strips MB bent into a U-shape, one leg of which is attached to the measurement board MP by a mounting pin S. The second leg is then connected at a contact point KP to the relevant connecting pin CP3, CP4 of the integrated circuit IC. The spring action in a C contact CK is achieved by the bending of the metal strip MB. It is also a disadvantage of C contacts CK that the minimum distance d between the measurement board MP and the chip IC is predetermined by the length of the metal strip.

The prior art solutions for contacting chips under test have a number of disadvantages. Heat conduction from the chip is practically impossible due to the small contact area and the great distance of the chip from the measurement board. Moreover, the long conduction paths through the metal strip or the pogo pin result in parasitic effects in high-frequency operation. At especially high frequencies the C-contacts or pogo pins act as antennas, so that reliable testing of such HF circuits in the chip is practically impossible. However, it is not possible in the present day to do without the resilient action of the contact, since modern packages themselves no longer have resilient contact legs. This is especially true of packaged circuits for high-frequency applications. Rather, so-called QFN packages (QFN=quad flat no lead) have no resilient contact legs. Such packages have only flat contact locations on the bottom of the package.

SUMMARY OF THE INVENTION

It is therefore an object of the present invention to provide an arrangement for contacting an integrated circuit in a package that exhibits no parasitic effects in high-frequency operation of the integrated circuit and that, in particular, is as simple as possible to manufacture.

In accordance therewith, an arrangement is provided for contacting a circuit embedded in a package by at least one contact plate arranged on a circuit carrier, wherein the package has contact locations on the contact plate side, wherein the contact plate has contact vanes which are formed such that they have a spring action directed normal towards the circuit carrier and such that the contact vanes can be brought substantially parallel to the circuit carrier by pressing the package against the contact vanes, and wherein the contact vanes each establish an electrical connection with the associated contact locations in the state in which they are pressed against the circuit carrier.

Thus, a spring action is achieved through the contact vanes, which function as leaf springs in principle. A minimum distance between the chip package and the circuit carrier is achieved through the inventive forming of these contact vanes, which establish the electrical contact with the contact locations or contact pads of the package. Since the contact vanes are flat and extend parallel to the circuit carrier in the state in which they are pressed against the circuit carrier, their electrical properties can also be determined and controlled especially well even in high frequency applications.

Advantageous embodiments and further developments of the invention are evident from the dependent claims and the description with reference to the drawing.

Preferably the contact vanes, in the state in which they are not pressed against the circuit carrier, are bent toward the package or the contact vanes are bent such that a side of each contact vane facing the circuit carrier always points essentially toward the circuit carrier. These forms of the contact vanes have the advantage that the contact vanes cannot jam or be creased when pressed against the package.

In an advantageous embodiment of the invention, each of the contact vanes has a length, width and mutual separation such that the contact vanes in the state pressed against the circuit carrier have a predefined characteristic impedance. For example, the contact vanes in this state can have a characteristic impedance of between 40Ω and 80Ω, preferably 50Ω.

When the contact vanes have a rectangular shape, the characteristic impedance can be easily determined or calculated, for example, and the contact plate can thus be specifically adapted for a packaged integrated circuit under test. For high frequency applications, impedances of 50Ω are typically chosen.

It is especially advantageous for the contact vanes to be designed to form a microstrip line in the state when pressed against the circuit carrier together with a conductive layer contained in the circuit carrier and spaced apart from the contact vanes. A microstrip line essentially includes a thin conductive trace, which can be embodied as a contact vane, and an electrically conductive plane spaced apart therefrom. The high frequency properties, in particular the characteristic impedance, of such a microstrip line are determined by the spacings and geometries of the two conductors relative to one another as well as by a dielectric located between them. Since the circuit carrier comprises a circuit board, for example, a predefined microstrip line can be embodied in a simple manner, and the electrical properties and high-frequency properties can be precisely matched to the chip to be tested.

In an embodiment of the inventive arrangement, the contact plate is soldered or glued to the circuit carrier. The circuit carrier can constitute a measurement board or a portion thereof for testing the packaged integrated circuit. The contact plate is made of resilient and electrically conductive material, preferably phosphor bronze, spring steel, gold, silver, platinum and/or copper. In this regard, the contact vanes can be at least partially plated with low-resistance material in order to achieve a better contact with the contact locations on the package.

In a special embodiment, the contact plate is designed with multiple parts. A multi-part design for the contact plate can be advantageous in order to be able to embody flexible geometric forms for the contact vanes. As a general rule, a contact plate can initially be formed contiguously, for example by an etching process, and can then be cut apart.

In a preferred further development of the invention, the contact plate has a flat or planar region for thermal contact with a heat slug of the integrated circuit or of the package. Many highly integrated components have a heat slug centrally located on the underside of their package for removal of heat. Since, in accordance with the invention, the contact vanes in the state pressed against the circuit carrier and the contact plate each extend parallel to the circuit carrier and parallel to the circuit-carrier side of the package, thermal contact is especially simple. At the same time, an electrical connection can be provided by this for establishing a ground contact.

In a further embodiment, stops for the package are provided on the package side of the contact plate in order to bring the contact vanes or contact points into alignment over the contact locations of the package. The package can be locked onto the contact plate by means of a preferably insulating pressure pad.

Use of the inventive arrangement is particularly suitable for contacting a QFN package when the contact vanes are appropriately arranged to form an electrical connection with the contact locations of a QFN package.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 3a-c illustrate an arrangement for contacting according to the conventional art by pogo pins or C contacts.

DETAILED DESCRIPTION

Figure 1:
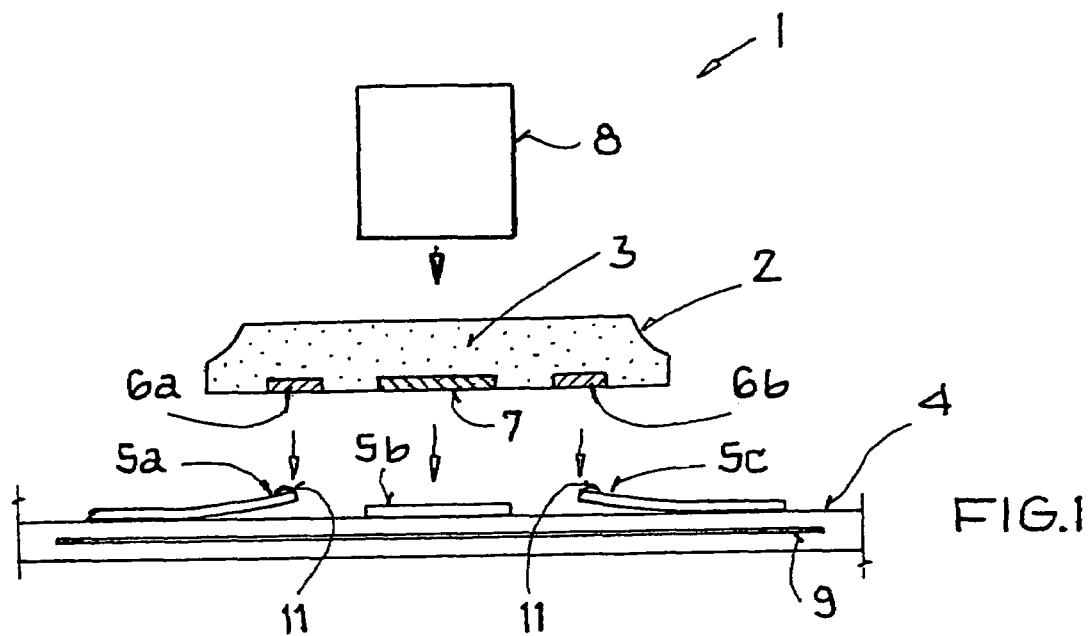
FIG. 1 is a side view of the inventive arrangement.

In the drawings, like or functionally like elements and signals are identified with the same reference labels, unless otherwise specified.

FIG. 1 shows an example embodiment of the inventive arrangement 1 for contacting an integrated circuit 3 in a package 2 by a contact plate 5a, 5b, 5c arranged on a circuit carrier 4.

The package 2 of the integrated circuit 3 has, on the underside or on the side facing the circuit carrier 4, contact locations 6a, 6b and a heat slug 7 for heat conduction. In this example embodiment, the contact plate 5a, 5b, 5c has contact vanes 5a, 5c bent toward the package 2, and has a flat region 5b provided for thermal contact and for good electrical ground contact with the heat slug 7 of the chip under test or with the integrated circuit 3 in the package 2.

To establish the contact between the contact vanes 5a, 5c and the corresponding contact locations 6a, 6b, the package 2 is pressed toward the circuit carrier 4 on the contact plate 5a, 5b, 5c by a pressure pad 8, which typically is made of an insulating material. In this context, the contact vanes 5a, 5c, which are initially bent up, act as springs and establish an electrical contact through the spring pressure of the contact locations 6a, 6b.

In this state pressed onto the circuit carrier 4, the contact vanes 5a, 5c extend parallel to the circuit carrier 4 as well as parallel to the underside of the package 2. In this pressed-on state, the contact vanes 5a, 5c form, together with an electrically conductive layer 9 contained in the circuit carrier 4, a microstrip line. In this regard the circuit carrier material, for example, can serve as a dielectric. However, additional contained dielectrics such as glass-fiber-reinforced Teflon, ceramic powder additives, quartz, or, e.g., aluminum oxide, may also serve as the dielectric.

The circuit carrier generally has additional measurement circuits, not shown here, which serve the purposes of test signal generation and analysis of signals coupled into and out of the chip 2, 3 under test. The contact plate 5a, 5b, 5c serving to establish the contact is, for example, soldered to additional traces of the measurement board or the circuit carrier 4.

Figure 2A:
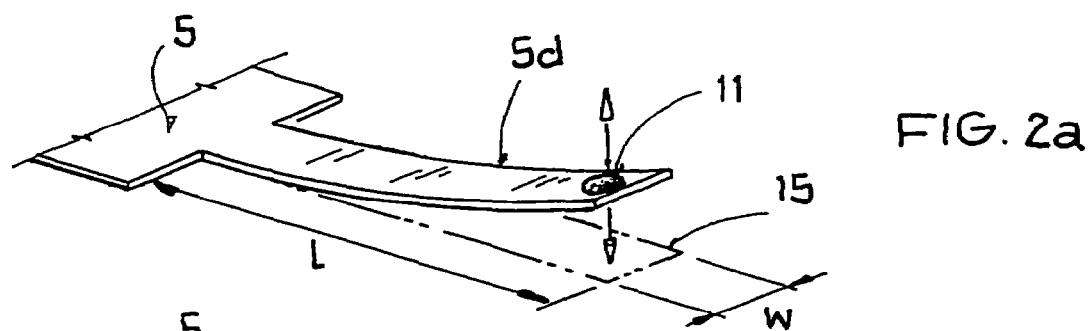
FIGS. 2a-c illustrate embodiments of inventive contact vanes.
Figure 2B:
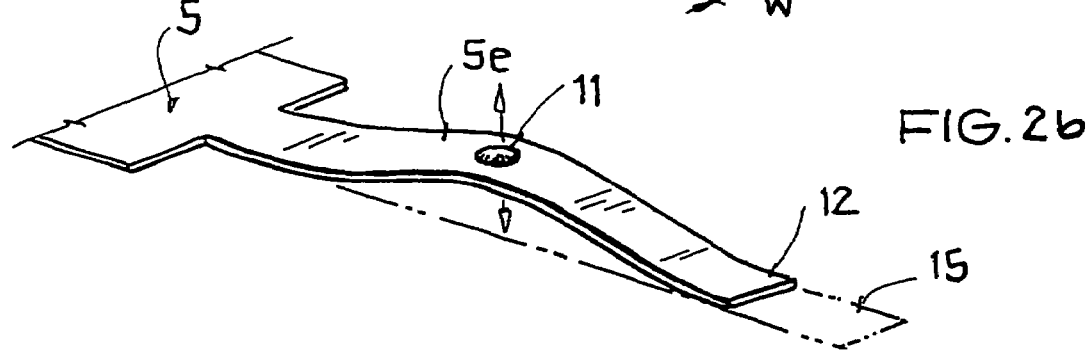
Figure 2C:
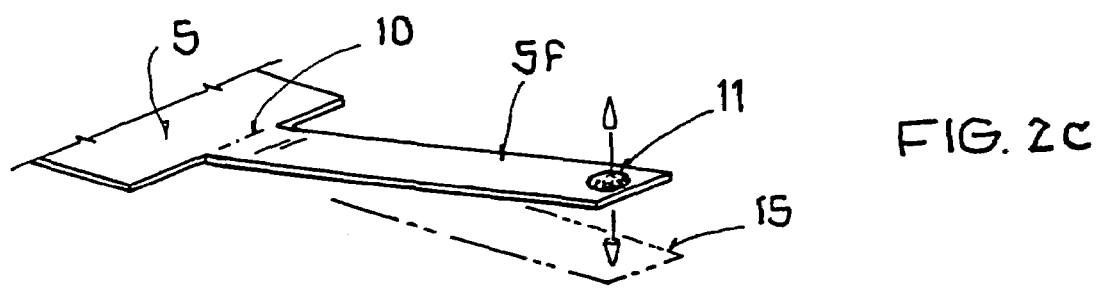

FIGS. 2a-c shows three possible inventive ways to form the contact vanes or contact prongs. In FIG. 2a, the contact vane 5d is bent uniformly over its length I toward the package. In the pressed-down state 15, which is indicated by the dashed lines, the greatest spring force is directed normal to the plane of the circuit carrier 4 or to the contact plate 5.

In FIG. 2b, another possibility for forming a contact prong 5e is shown. Here, one end 12 of the contact vane 5e rests snugly against the circuit carrier 4 both when the entire contact vane 5e is pressed down and when it is not pressed down. Here, a contact point 11 is provided approximately in the center of the length l of the contact prong 5e.

A third example possibility for forming a contact vane 5f is shown in FIG. 2c. In this option, a crease 10 is provided at the start of the contact vane 5f at the transition to the rest of the contact plate 5, while the contact prong 5f itself extends flat and without deformation.

All three example embodiments have in common that the relevant contact prong 5d, 5e, 5f extends completely parallel to or rests snugly against the circuit carrier 4 in the state 15 when pressed against the circuit carrier 4. The side of the contact vanes 5d, 5e, 5f facing the circuit carrier 4 always extends toward the circuit carrier in the bent or deflected state, i.e. a vector along a relevant contact vane 5d, 5e, 5f never has a perpendicular component to the circuit carrier 4 or to the underside of the package 2 that is greater than a parallel component. In particular, the inventive characteristic permits the formation of a microstrip line by a relevant contact prong 5d, 5e, 5f and a conductive layer 9 in the circuit carrier 4. The properties of the microstrip line can be predetermined by the choice of width w and length l as well as the separations of multiple contact prongs from one another. As a general rule, the contact plates are made of conductive, elastic material, for example spring metal sheet such as Pbz.

Figure 4:
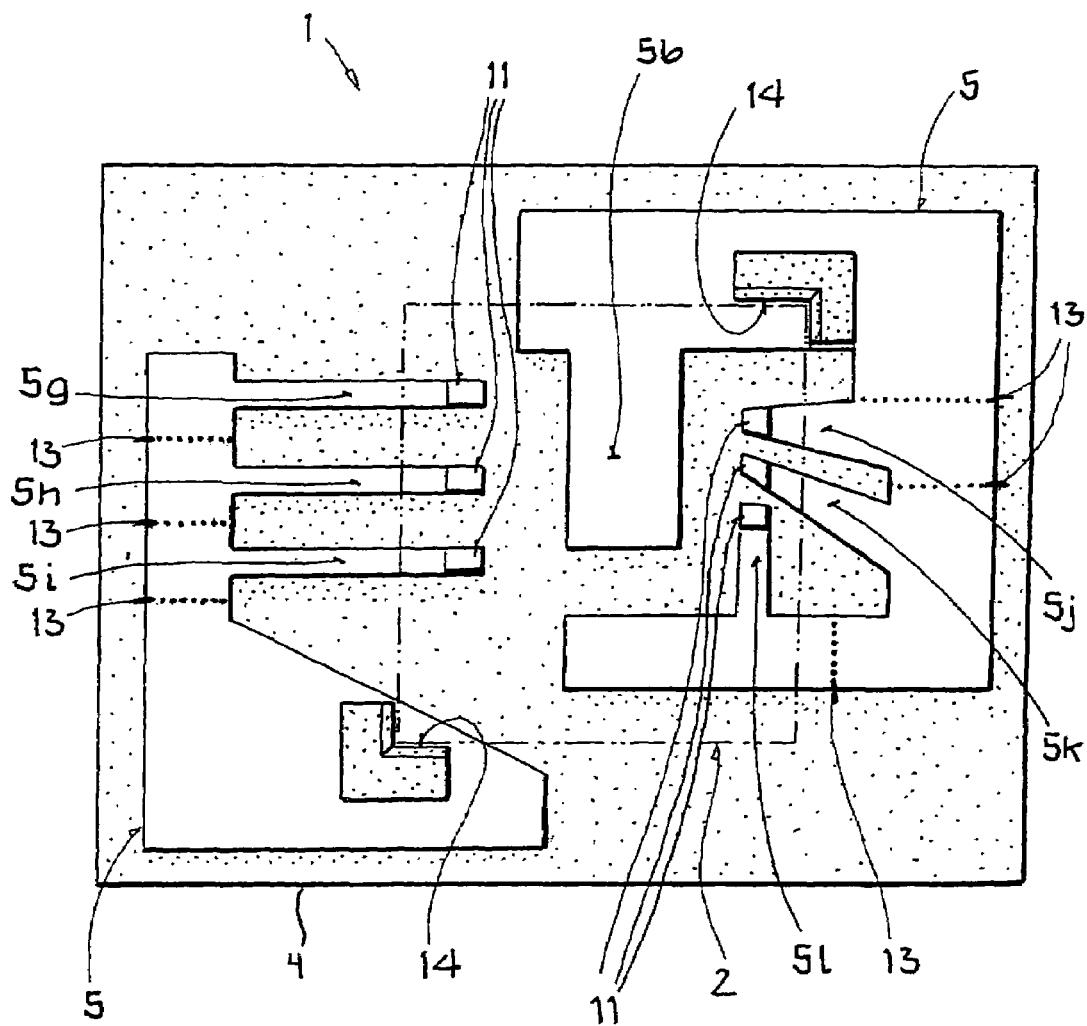
FIG. 4 illustrates another example embodiment of the invention for providing contact.

FIG. 4 shows an aspect of an inventive arrangement 1. Arranged on the circuit carrier 4 here, which represents the lowest level, is a two-part contact plate 5, which has multiple contact vanes 5g-5l.

The parts of the contact plate 5 are manufactured by, for example, conventional etching methods, laser methods, or even stamping methods for relatively large quantities. The thickness is 200 micrometers, for example, but can be other thicknesses as well. In comparison to customary conductive traces on measurement boards, which are approximately 20 micrometers thick, as a general rule the contact plate is made significantly thicker. This spring steel for the contact plate 5 is then soldered onto the suitably structured measurement board or the circuit carrier 4. So that the contact vanes 5g-5l are not shorted together, they are cut apart as is shown in FIG. 4 by dotted cut lines 13. The contact vanes 5g-5l are then bent up so that the resilient action occurs normal to the measurement board 4.

In the example embodiment shown here, the contact vanes 5g-5i each have contact points 11, which are plated with an especially low-resistance material. The contact plate 5 also has a central flat region 5b, which is used to make thermal contact with a heat slug of the integrated circuit to be tested or contacted. The position of the package 2 is shown by the dashed line.

The arrangement also has stops 14 so that it is always easy to bring the contact points 11 and the contact locations 6 of the package 2 into alignment. In a test of the chip to be contacted, the package 2 is placed on the contact plate 5 and is pressed onto the contact surfaces by the pressure pad 8. In this process, the contact vanes 5g-5l deflect towards the board 4 and in this position form a microstrip line with the boards or the circuit carrier material and a conductive layer contained therein. Moreover, the flat, large-area contact region 5b achieves especially good thermal conduction with the slug of the component, as well as a good ground contact.

The inventive arrangement for contacting an integrated circuit in a package has a number of advantages over prior art contacting methods or arrangements. The inventive contact plate is simple to manufacture by means of etching processes and is simple to connect to the circuit carrier. No individual springs or contacts are required. The inventive forming of the contact vanes and their action as leaf springs supplies adequate pressure on the contact locations of the package and creates a good electrical connection. Moreover, the inventive arrangement permits an especially close connection or a small distance between the package and the circuit carrier. As a result of the inventive pressing of the contact vanes on the circuit carrier, and the microstrip line thus produced, the inventive arrangement has controllable high frequency characteristics practically without parasitic elements. These high frequency characteristics, such as, for example, the characteristic impedance of the microstrip line, can easily be matched to desired HF properties at over 6 GHz through the shape and size of the contact vanes. In addition, a flat central region of the contact plate creates a good thermal connection between the package and the circuit carrier, and thereby provides heat removal. Moreover, the central region provides a good ground contact.

Although the present invention was described above on the basis of a preferred example embodiment, it is not limited thereto, but can rather be modified in many diverse ways.

In particular, the shape of the contact vanes can be modified as desired in order to achieve the desired HF characteristics of the microstrip line to be achieved. The contact plate can be made of any desired conductive materials as long as adequate spring action takes place as a result of the forming of the contact vanes. The use of the inventive arrangement is not limited to chip test sockets, but is rather always an option when components must be frequently replaced, for example. A locking of the chip to be contacted is then possible by additional means. The contact plate can include multiple layers in order to achieve the desired flexible characteristics.

Although the package was always pressed toward the contact plate or the circuit carrier in the description, an opposite direction is of course equally possible. The circuit carrier with the contact plate is then pressed against the package of a circuit under test so that the inventively arranged contact vanes create an electrical contact with contact locations of the package.

The invention combines and optimizes, in a simple way, mechanical, electrical, and thermal connections between the circuit carrier and the chip to be contacted.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An arrangement for contacting a circuit arranged in a package by at least one contact plate arranged on a circuit carrier, the package having contact locations on a contact plate side thereof, the contact plate having resilient contact vanes that are formed such that they have a spring action directed normal to the circuit carrier and such that the contact vanes can be brought substantially parallel to the circuit carrier by pressing the package against the contact vanes, the contact vanes each facilitating an electrical connection with the contact locations in the state in which they are pressed against the circuit carrier, wherein the contact vanes are designed to form at least one microstrip line in the state pressed against the circuit carrier together with a conductive layer contained in the circuit carrier and spaced apart from the contact vanes.

2. An arrangement for contacting a circuit arranged in a package by at least one contact plate arranged on a circuit carrier, the package having contact locations on a contact plate side thereof, the contact plate having resilient contact vanes that are formed such that they have a spring action directed normal to the circuit carrier and such that the contact vanes can be brought substantially parallel to the circuit carrier by pressing the package against the contact vanes, the contact vanes each facilitating an electrical connection with the contact locations in the state in which they are pressed against the circuit carrier, wherein the contact vanes have a substantially uniform thickness and the circuit carrier is spaced from said package by a distance substantially equal to said thickness of said resilient contact vanes when the package is pressed against the contact vanes and when the contact vanes are substantially parallel to the circuit carrier.

3. An arrangement according to claim 2, wherein the contact vanes, in the state in which they are not pressed against the circuit carrier, are bent toward the package.

4. The arrangement according to claim 2, wherein the contact vanes, in the state in which they are not pressed against the circuit carrier, are bent such that a side of each contact vane facing the circuit carrier points essentially towards the circuit carrier.

5. The arrangement according to claim 2, wherein the contact vanes each have a length (l), width (w) and mutual separation such that the contact vanes in the state pressed against the circuit carrier have a predefined characteristic impedance.

6. The arrangement according to claim 2, wherein the contact plate is soldered or glued to the circuit carrier.

7. The arrangement according to claim 2, wherein the circuit carrier is a measurement board or a portion thereof for testing the integrated circuit.

8. The arrangement according to claim 2, wherein the contact plate contains phosphor bronze, spring steel, gold, silver, platinum and/or copper.

9. The arrangement according to claim 2, wherein the at least one contact vane is at least partially plated with a low-resistance material.

10. The arrangement according to claim 2, wherein at least one of the contact vanes has its own contact point made of a low-resistance material in order to achieve contact with the contact locations.

11. The arrangement according to claim 2, wherein the contact plate is formed in multiple parts.

12. The arrangement according to claim 2, wherein the contact plate has a substantially flat region for establishing ground contact of the package with the circuit carrier.

13. The arrangement according to claim 2, wherein the contact plate has a substantially flat region for thermal contact with a heat slug of the integrated circuit or of the package.

14. The arrangement according to claim 13, wherein the flat region has an electrical connection for ground contact with the heat slug of the integrated circuit or of the package.

15. The arrangement according to claim 2, wherein stops for the package are provided on the package side of the contact plate in order to bring the contact vanes or contact points into alignment with the contact locations of the package.

16. The arrangement according to claim 2, wherein a pressure pad is provided for pressing the package on the contact plate.

17. The arrangement according to claim 2, wherein the contact vanes are arranged to form an electrical connection with the contact locations of a QFN package such that the contact vanes or contact points are in alignment over the contact locations of the QFN package.

18. The arrangement according to claim 2, wherein the thickness of the contact vane is determined based on a distance between a lower surface of the contact vane and an upper surface of the contact vane or an upper portion of a contact point disposed on the contact vane.

19. A contact device for testing an integrated circuit, the contact device comprising:
a circuit carrier;
a contact plate on a surface of the circuit carrier; and
a contact vane extending from the contact plate and having a first end portion proximal to the contact plate, a second end portion distal from the contact plate, a central portion between said first end portion and said second end portion, and a first side facing the circuit carrier and a second side opposite said first side;
wherein, when each of said first end portion, said second end portion and said central portion contact said circuit carrier, said second side is spaced from said circuit by a distance substantially equal to a thickness of said contact plate.

20. The contact device according to claim 19, wherein the circuit carrier is formed of a dielectric.

21. The contact device according to claim 19, wherein the contact plate and the contact vane are formed of one piece.

22. The contact device according to claim 19, wherein the contact vane resiliently extends from the contact plate so that the contact vane is movable in a direction that is substantially perpendicular to the surface of the circuit carrier when the contact vane is moved between the first state and the testing state.

23. The contact device according to claim 19, wherein the contact vane is U shaped.

24. An arrangement for an integrated circuit measurement board, the arrangement comprising:
a circuit carrier having at least one conductive microstrip line; and
at least one contact vane having a first end and a second end, the first end of the contact vane fixedly holding the contact vane to an upper surface of the circuit carrier, the contact vane having a portion thereof extending towards the second end of the contact vane and in a direction away from the upper surface of the circuit carrier such that the extending portion of the contact vane is forceably moveable from a non-contact position to a contact position,
wherein, in the contact position a first side of the contact vane electrically contacts the conductive microstrip line and a second side of the contact vane is configured to electrically contact a package, thereby facilitating an electrical connection between the package and the conductive microstrip line, and
wherein the first side and the second side of the contact vane are opposite and substantially parallel to one another.

25. An arrangement for an integrated circuit measurement board, the arrangement comprising:
a circuit carrier having at least one conductive microstrip line; and
at least one contact vane being fixedly held to an upper surface of the circuit carrier at a first end of the contact, vane, the contact vane having a resilient member projecting outward from a fulcrum point and substantially horizontally from the first end with respect to the upper surface of the circuit carrier, the resilient member having a contact surface for facilitating an electrical connection between a package to be tested and the at least once conductive microstrip line, the contact surface being cantilevered from the first end such that the fulcrum point is laterally spaced away from the contact surface with respect to the upper surface of the circuit carrier.

* * * * *